US009035371B2

(12) United States Patent
Nakajima

(10) Patent No.: US 9,035,371 B2
(45) Date of Patent: May 19, 2015

(54) NONVOLATILE SEMICONDUCTOR MEMORY DEVICE

(71) Applicant: Kabushiki Kaisha Toshiba, Tokyo (JP)

(72) Inventor: Hiroomi Nakajima, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 13/848,232

(22) Filed: Mar. 21, 2013

(65) Prior Publication Data

US 2014/0061751 A1    Mar. 6, 2014

Related U.S. Application Data

(60) Provisional application No. 61/696,980, filed on Sep. 5, 2012.

(51) Int. Cl.
*H01L 29/792* (2006.01)
*H01L 27/088* (2006.01)
*H01L 27/115* (2006.01)
*H01L 23/00* (2006.01)

(52) U.S. Cl.
CPC ........ H01L 27/088 (2013.01); H01L 27/11573 (2013.01); H01L 27/11582 (2013.01); *H01L 24/05* (2013.01)

(58) Field of Classification Search
CPC .................. H01L 27/11529; H01L 27/11592; H01L 27/11582
USPC ..................... 257/324, 316, E21.21, E21.409; 438/591
See application file for complete search history.

(56) References Cited

U.S. PATENT DOCUMENTS

| 8,338,882 B2 * | 12/2012 | Tanaka et al. ............... 257/324 |
| 2001/0045669 A1 | 11/2001 | Liang et al. |
| 2004/0164418 A1 | 8/2004 | Sugiura et al. |
| 2005/0173806 A1 | 8/2005 | Matsubara |
| 2012/0241843 A1 * | 9/2012 | Iino et al. ..................... 257/324 |
| 2013/0105902 A1 * | 5/2013 | Uenaka et al. ............... 257/368 |

FOREIGN PATENT DOCUMENTS

| JP | 2003-530696 A | 10/2003 |
| JP | 2004-282000 A | 10/2004 |
| JP | 2005-223245 A | 8/2005 |
| JP | 2007-180363 A | 7/2007 |

* cited by examiner

*Primary Examiner* — Jarrett Stark
*Assistant Examiner* — Shahed Ahmed
(74) *Attorney, Agent, or Firm* — Oblon, McClelland, Maier & Neustadt, L.L.P.

(57) ABSTRACT

According to one embodiment, a nonvolatile semiconductor memory device includes a memory cell region provided with a plurality of memory cells, and a peripheral region provided around the memory cell region. The device includes: a foundation layer provided in the memory cell region and in the peripheral region, the foundation layer including a plurality of wiring layers and a plurality of device elements; and a stacked body provided on the foundation layer, the stacked body including a plurality of electrode layers and a plurality of intermediate layers alternately stacked. The peripheral region includes an interlayer insulating film provided on the stacked body; and an electrode pad provided on the interlayer insulating film and electrically connected to one of the plurality of wiring layers.

20 Claims, 13 Drawing Sheets

NONVOLATILE SEMICONDUCTOR MEMORY DEVICE

CROSS-REFERENCE TO RELATED APPLICATIONS

This application is based upon and claims the benefit of priority from the prior U.S. Provisional Patent Application 61/696,980, filed on Sep. 5, 2012; the entire contents of which are incorporated herein by reference.

FIELD

Embodiments described herein relate generally to a nonvolatile semiconductor memory device.

BACKGROUND

A nonvolatile semiconductor memory device as typified by a floating gate NAND memory is provided with not only memory cells and peripheral circuits, but also electrode pads for wire bonding. To such an electrode pad, a metal wire is bonded by a bonding tool.

However, if the strength below the electrode pad is insufficient in the nonvolatile semiconductor memory device, impact of the bonding tool on the electrode pad may destroy the layer below the electrode pad. In view of preventing this destruction, wirings and device elements cannot be placed below the electrode pad. This limits downsizing of the nonvolatile semiconductor memory device.

DETAILED DESCRIPTION

Figure 1:
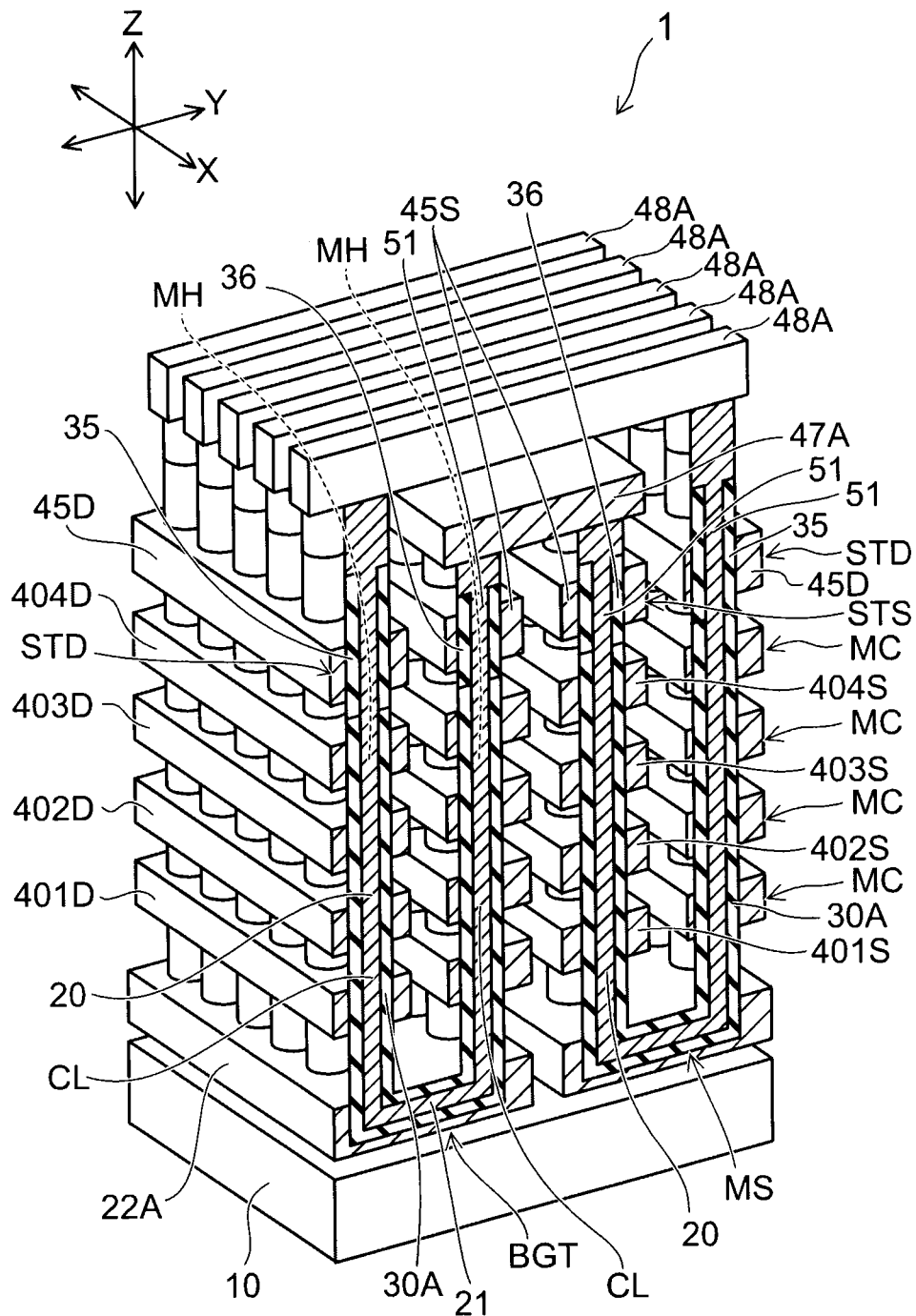
FIG. 1 is a schematic perspective view of a memory cell array section of the nonvolatile semiconductor memory device according to a first embodiment.

In general, according to one embodiment, a nonvolatile semiconductor memory device includes a memory cell region provided with a plurality of memory cells, and a peripheral region provided around the memory cell region. The device includes: a foundation layer provided in the memory cell region and in the peripheral region, the foundation layer including a plurality of wiring layers and a plurality of device elements; and a stacked body provided on the foundation layer, the stacked body including a plurality of electrode layers and a plurality of intermediate layers alternately stacked.

The memory cell region includes: a pair of first channel body layers penetrating through the stacked body and the pair of first channel body layers extending from an upper surface of the stacked body to a lower surface of the stacked body; a memory film provided between each of the pair of first channel body layers and each of the plurality of electrode layers; a pair of select gate electrodes provided on the stacked body; a second channel body layer penetrating through each of the pair of select gate electrodes and the second channel body layer being connected to each of the pair of first channel body layers; and a gate insulating film provided between each of the pair of select gate electrodes and the second channel body layer.

The peripheral region includes an interlayer insulating film provided on the stacked body; and an electrode pad provided on the interlayer insulating film and electrically connected to one of the plurality of wiring layers.

Embodiments will now be described with reference to the drawings. In the following description, like members are labeled with like reference numerals. The description of the members once described is omitted appropriately.

(First Embodiment)

An overview of memory cells of a nonvolatile semiconductor memory device according to a first embodiment is described.

FIG. 1 is a schematic perspective view of a memory cell array section of the nonvolatile semiconductor memory device according to the first embodiment.

Figure 2:
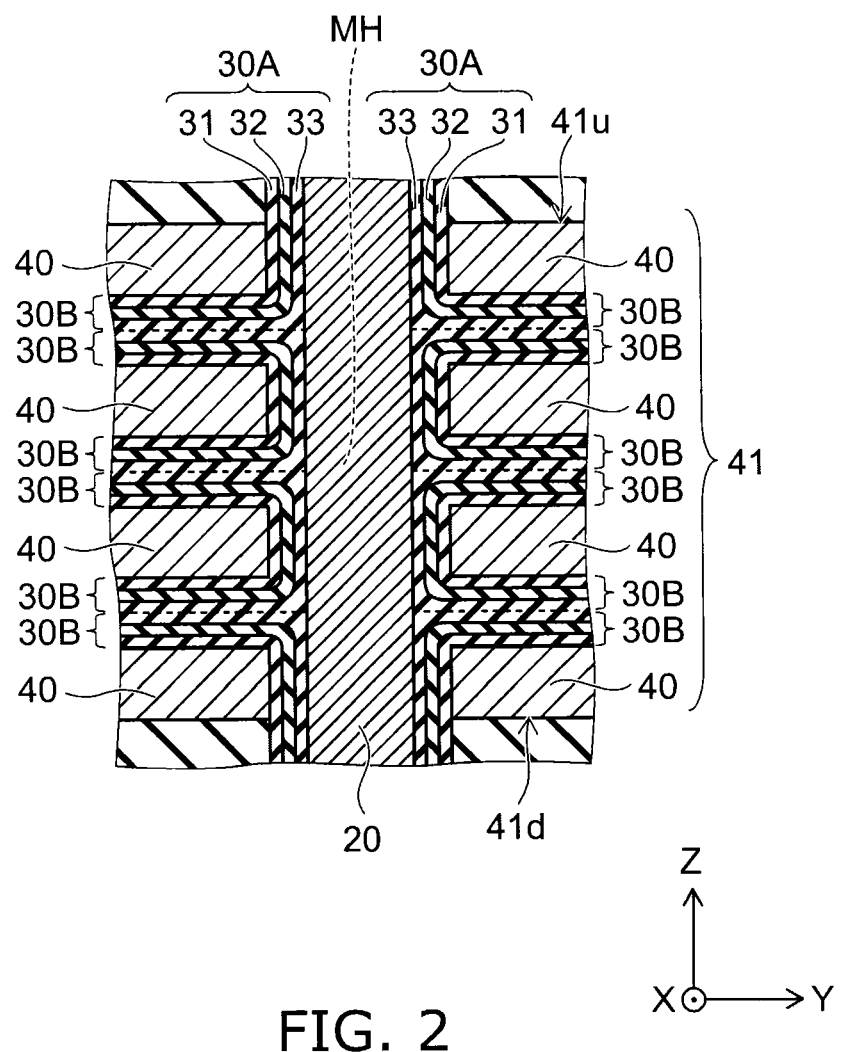
FIG. 2 is an enlarged schematic sectional view of the memory cell section according to the first embodiment.

FIG. 2 is an enlarged schematic sectional view of the memory cell section according to the first embodiment.

In FIG. 1, for clarity of illustration, insulating portions other than the insulating film formed on the inner wall of the memory hole MH are not shown.

In FIG. 1, for convenience of description, an XYZ orthogonal coordinate system is introduced. In this coordinate system, two directions parallel to the major surface of the substrate 10 and orthogonal to each other are referred to as X direction and Y direction. The direction orthogonal to both these X and Y directions is referred to as Z direction.

In the nonvolatile semiconductor memory device 1, on a substrate 10, a back gate 22A is provided via an insulating layer, not shown.

Figure 3:
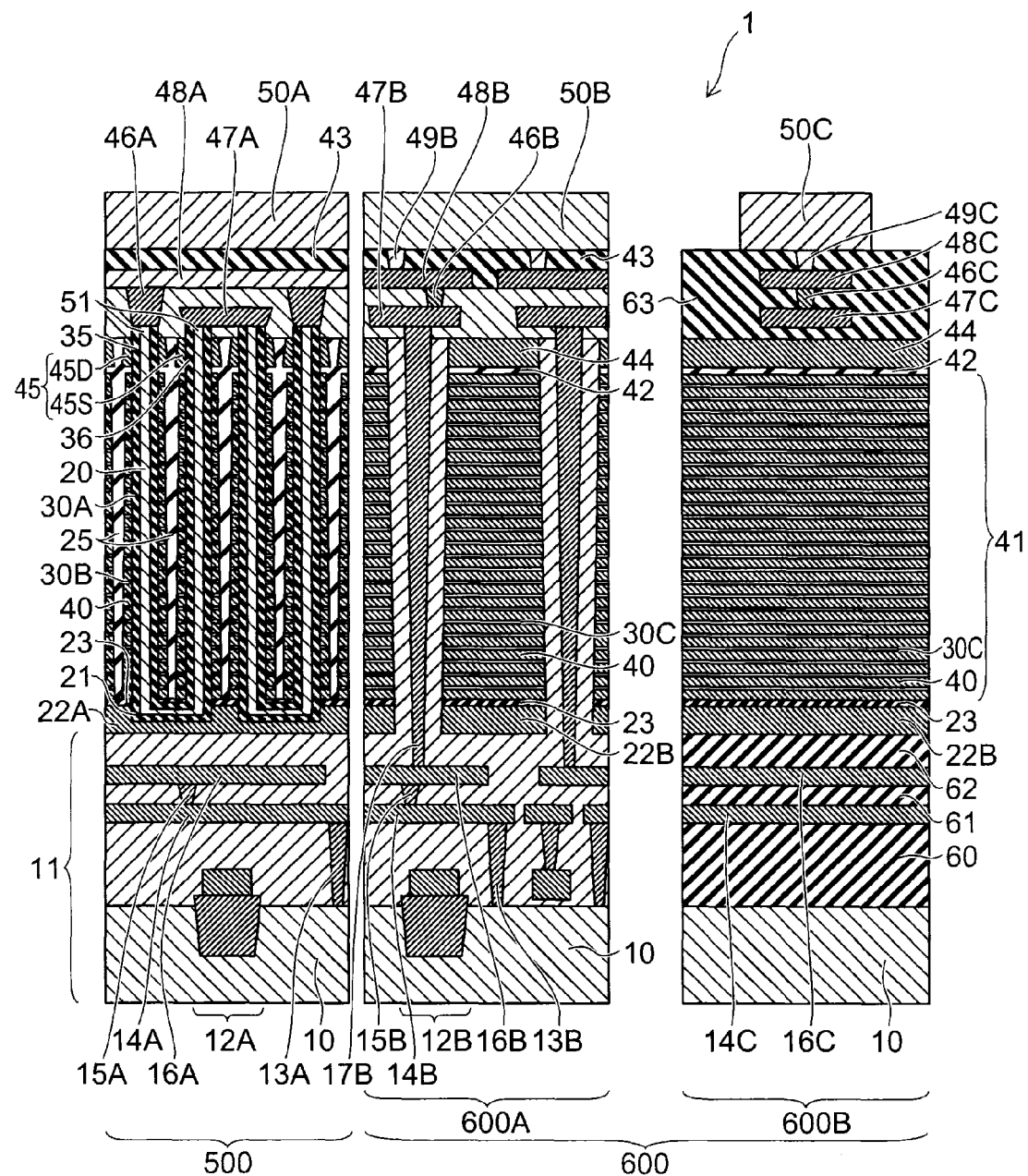
FIG. 3 is a schematic sectional view of the memory cell array section and the peripheral region of the memory cell array section of the nonvolatile semiconductor memory device according to the first embodiment.

The substrate 10 and this insulating layer are collectively referred to as foundation layer (the foundation layer 11 in FIG. 3). In the substrate 10, active elements such as transistors, and passive elements such as resistors and capacitors are provided. The back gate 22A is e.g. a silicon (Si) layer doped with an impurity element.

On the back gate 22A, a plurality of insulating layers 30B (see FIG. 2), electrode layers 401D, 402D, 403D, 404D on the drain side, and electrode layers 401S, 402S, 403S, 404S on the source side are alternately stacked.

The electrode layer 401D and the electrode layer 401S are provided at the same level and represent first lowest electrode layers. The electrode layer 402D and the electrode layer 402S are provided at the same level and represent second lowest electrode layers. The electrode layer 403D and the electrode layer 403S are provided at the same level and represent third lowest electrode layers. The electrode layer 404D and the electrode layer 404S are provided at the same level and represent fourth lowest electrode layers.

The electrode layer 401D and the electrode layer 401S are divided in the Y direction. The electrode layer 402D and the electrode layer 402S are divided in the Y direction. The electrode layer 403D and the electrode layer 403S are divided in the Y direction. The electrode layer 404D and the electrode layer 404S are divided in the Y direction.

An insulating layer, not shown, is provided between the electrode layer 401D and the electrode layer 401S, between the electrode layer 402D and the electrode layer 402S, between the electrode layer 403D and the electrode layer 403S, and between the electrode layer 404D and the electrode layer 404S.

The electrode layers 401D, 402D, 403D, 404D are provided between the back gate 22A and a drain side select gate electrode 45D. The electrode layers 401S, 402S, 403S, 404S are provided between the back gate 22A and a source side select gate electrode 45S.

The number of layers of the electrode layers 401D, 402D, 403D, 404D, 401S, 402S, 403S, 404S is arbitrary, and not limited to four layers illustrated in FIG. 1. In the following description, the electrode layers 401D, 402D, 403D, 404D, 401S, 402S, 403S, 404S may also be collectively and simply referred to as electrode layers 40.

The electrode layer 40 is e.g. a silicon layer doped with an impurity element such as boron (B) and having conductivity. In the first embodiment, as the insulating layer 30B, an insulating layer of an ONO structure is illustrated (described later).

On the electrode layer 404D, a drain side select gate electrode 45D is provided via an insulating layer, not shown. The drain side select gate electrode 45D is e.g. a silicon layer doped with impurity and having conductivity.

On the electrode layer 404S, a source side select gate electrode 45S is provided via an insulating layer, not shown. The source side select gate electrode 45S is e.g. a silicon layer doped with impurity and having conductivity.

The drain side select gate electrode 45D and the source side select gate electrode 45S are divided in the Y direction. The drain side select gate electrode 45D and the source side select gate electrode 45S may also be simply referred to as select gate electrode 45 without distinction.

On the source side select gate electrode 45S, a source line 47A is provided via an insulating layer, not shown. The source line 47A is connected to a channel body layer 51 connected to one of a pair of channel body layers 20. The source line 47A is a metal layer, or a silicon layer doped with impurity and having conductivity.

On the drain side select gate electrode 45D and the source line 47A, a plurality of bit lines 48A are provided via an insulating layer, not shown. The bit lines 48A are connected to a channel body layer 51 connected to the other of the pair of channel body layers 20. Each bit line 48A extends in the Y direction.

In the back gate 22A and the stacked body 41 on this back gate 22A, a plurality of U-shaped memory holes MH are formed. For instance, in the electrode layers 401D-404D and the drain side select gate electrode 45D, holes penetrating therethrough and extending in the Z direction are formed. In the electrode layers 401S-404S and the source side select gate electrode 45S, holes penetrating therethrough and extending in the Z direction are formed. A pair of the holes extending in the Z direction are linked via a recess (space portion) formed in the back gate 22A to constitute a U-shaped memory hole MH.

Inside the memory hole MH, a channel body layer 20 (first channel body layer) is provided in a U-shape. The channel body layer 20 is e.g. a silicon layer. A memory film 30A is provided between the channel body layer 20 and the inner wall of the memory hole MH.

A gate insulating film 35 is provided between the channel body layer 51 (second channel body layer) connected to the channel body layer 20 and the drain side select gate electrode 45D. The channel body layer 51 is e.g. a silicon layer. A gate insulating film 36 is provided between the channel body layer 51 and the source side select gate electrode 45S.

Here, the embodiment is not limited to the structure in which the inside of the memory hole MH is entirely filled with the channel body layer 20. As an alternative structure, the channel body layer 20 may be formed so as to leave a void portion on the central axis side of the memory hole MH, and the inside void portion may be filled with insulator.

The memory film 30A has e.g. an ONO (oxide-nitride-oxide) structure in which a silicon nitride film is sandwiched between a pair of silicon oxide films. As shown in FIG. 2, between each electrode layer 40 and the channel body layer 20, sequentially from the electrode layer 40 side, an insulating film 31, a charge accumulation film 32, and an insulating film 33 are provided. The insulating film 31 is in contact with the electrode layer 40. The insulating film 33 is in contact with the channel body layer 20. The charge accumulation film 32 is provided between the insulating film 31 and the insulating film 33. Here, between the electrode layers 40, two insulating layers 30B are provided. The insulating film 31 is e.g. a silicon oxide film. The charge accumulation film 32 is e.g. a silicon nitride film. The insulating film 33 is e.g. a silicon oxide film.

The channel body layer 20 functions as a channel in a transistor constituting a memory cell. The electrode layer 40 functions as a control gate. The charge accumulation film 32 functions as a data memory layer for accumulating charge injected from the channel body layer 20. That is, at the intersection of the channel body layer 20 and each electrode layer 40, a memory cell MC having a structure with the channel surrounded with the control gate is formed.

The nonvolatile semiconductor memory device 1 of the first embodiment is a nonvolatile semiconductor memory device capable of electrically and freely erasing/writing data and retaining its memory content even when powered off.

The drain side select gate electrode 45D, the channel body layer 20, and the gate insulating film 35 therebetween constitute a drain side select transistor STD. The channel body layer 20 above the drain side select transistor STD is connected to a bit line 48A.

The source side select gate electrode 45S, the channel body layer 51, and the gate insulating film 36 therebetween constitute a source side select transistor STS. The channel body layer 51 above the source side select transistor STS is connected to a source line 47A.

The back gate 22A, the channel body layer 20 provided in this back gate 22A, and the memory film 30A constitute a back gate transistor BGT.

A plurality of memory cells MC with the electrode layers 404D-401D serving as control gates are provided between the drain side select transistor STD and the back gate transistor BGT. Similarly, a plurality of memory cells MC with the electrode layers 401S-404S serving as control gates are provided between the back gate transistor BGT and the source side select transistor STS.

The plurality of memory cells MC, the drain side select transistor STD, the back gate transistor BGT, and the source side select transistor STS are series connected via the channel body layer to constitute one U-shaped memory string MS.

One memory string MS includes a pair of columnar portions CL extending in the stacking direction of the stacked body 41 including a plurality of electrode layers 40, and a linking portion 21 embedded in the back gate 22A and linking the pair of columnar portions CL. A plurality of such memory strings MS are arranged in the X direction and the Y direction. Thus, a plurality of memory cells are provided three-dimensionally in the X direction, the Y direction, and the Z direction.

The plurality of memory strings MS are provided on a memory cell array region in the substrate 10. Around the periphery, for instance, of the memory cell array region in the substrate 10, a peripheral circuit for controlling the memory cell array is provided.

FIG. 3 is a schematic sectional view of the memory cell array section and the peripheral region of the memory cell array section of the nonvolatile semiconductor memory device according to the first embodiment.

FIG. 3 shows a cross section of the memory cell region 500 including memory cells of the nonvolatile semiconductor memory device 1, and a cross section of the peripheral region 600 around the memory cell region 500. Furthermore, the peripheral region 600 includes a peripheral circuit region 600A and an electrode pad formation region 600B. The memory cell region 500 and the peripheral region 600 each include a foundation layer 11. The foundation layer 11 includes the substrate 10.

Besides the foregoing, in the memory cell region 500, a transistor 12A is provided on the substrate 10 of the foundation layer 11. The transistor 12A is connected to e.g. a wiring layer 14A through a via 13A. Furthermore, the wiring layer 14A is connected to a wiring layer 16A through a via 15A. These wiring layers and vias are surrounded with an interlayer insulating film so as to avoid short circuit therebetween.

An insulating layer 23 is provided between the back gate 22A and the stacked body 41. An insulating layer 25 is provided between a U-shaped pair of channel body layers 20 and between adjacent pairs of channel body layers 20. Furthermore, on the bit line 48A, a wiring layer 50A is provided via an interlayer insulating film 43. The bit line 48A is connected to the channel body layer 51 through a via 46A.

In the peripheral circuit region 600A, a transistor 12B is provided on the substrate 10 of the foundation layer 11. The transistor 12B is connected to e.g. a wiring layer 14B through a via 13B. The wiring layer 14B is connected to a wiring layer 16B through a via 15B. These wiring layers and vias are surrounded with an interlayer insulating film so as to avoid short circuit therebetween. Furthermore, a semiconductor layer 22B is provided between the foundation layer 11 and the stacked body 41. An insulating layer 23 is provided between the stacked body 41 and the semiconductor layer 22B.

Furthermore, in the peripheral circuit region 600A, the via 17B connected to the wiring layer 16B penetrates through the stacked body 41 and protrudes upward from the semiconductor layer 44. An insulating layer 42 is provided between the semiconductor layer 44 and the stacked body 41. The via 17B is connected to a wiring layer 47B provided above the semiconductor layer 44. The wiring layer 47B is connected to a wiring layer 48B through a via 46B. The wiring layer 48B is connected to a wiring layer 50B through a via 49B. These wiring layers and vias are surrounded with the interlayer insulating film 43 so as to avoid short circuit therebetween. The memory cell, for instance, is driven by the circuit provided in the peripheral circuit region 600A.

In the electrode pad formation region 600B, an interlayer insulating film 60 is provided on the substrate 10 of the foundation layer 11. A wiring layer 14C is provided on the interlayer insulating film 60. An interlayer insulating film 61 is provided on the wiring layer 14C. A wiring layer 16C is provided on the interlayer insulating film 61. An interlayer insulating film 62 is provided on the wiring layer 16C. A semiconductor layer 22B is provided on the interlayer insulating film 62. An insulating layer 23 is provided on the semiconductor layer 22B.

Furthermore, in the electrode pad formation region 600B, a stacked body 41 is provided on the insulating layer 23. An insulating layer 42 is provided on the stacked body 41. A semiconductor layer 44 is provided on the insulating layer 42. An interlayer insulating film 63 is provided on the semiconductor layer 44. An electrode pad 50C is provided on the interlayer insulating film 63. A via 49C, a conductive layer 48C, a via 46C, and a conductive layer 47C are connected to the electrode pad 50C. These vias and conductive layers are surrounded with the interlayer insulating film 63 so as to avoid short circuit therebetween.

The stacked body 41 in the peripheral region 600 is a stacked body in which a plurality of electrode layers 40 and a plurality of intermediate layers 30C are alternately stacked. The thickness of the stacked body 41 is 1.5 μm or more. The material of the intermediate layer 30C is one of insulators such as non-doped polysilicon and silicon oxide.

In this embodiment, the "insulating layer" and "insulator" include e.g. silicon oxide and silicon nitride. The "semiconductor" includes e.g. silicon.

Thus, the nonvolatile semiconductor memory device 1 according to the first embodiment includes a memory cell region 500 provided with a plurality of memory cells, and a peripheral region 600 provided around the memory cell region 500. The foundation layer 11 includes a plurality of wiring layers and a plurality of device elements provided in the memory cell region 500 and the peripheral region 600. The stacked body 41 is provided on the foundation layer 11. In the memory cell region 500, a plurality of electrode layers 40 and a plurality of insulating layers 30B are alternately stacked. In the peripheral region 600, a plurality of electrode layers 40 and a plurality of intermediate layers 30C are alternately stacked.

The memory cell region 500 includes a pair of channel body layers 20 penetrating through the stacked body 41 and extending from the upper surface 41u of the stacked body 41 to the lower surface 41d of the stacked body 41, a memory film 30A provided between each of the pair of channel body layers 20 and each of the plurality of electrode layers 40, a pair of select gate electrodes 45 provided on the stacked body 41, a channel body layer 51 penetrating through each of the pair of select gate electrodes 45 and connected to each of the pair of channel body layers 20, and a gate insulating film 35 (or gate insulating film 36) provided between each of the pair of select gate electrodes 45 and the channel body layer 51.

The peripheral region 600 includes an interlayer insulating film 63 provided on the stacked body 41. Furthermore, the peripheral region 600 includes an electrode pad 50C electrically connected to one of the plurality of wiring layers.

The electrode pad formation region 600B according to the first embodiment is now described in more detail.

Figure 4:
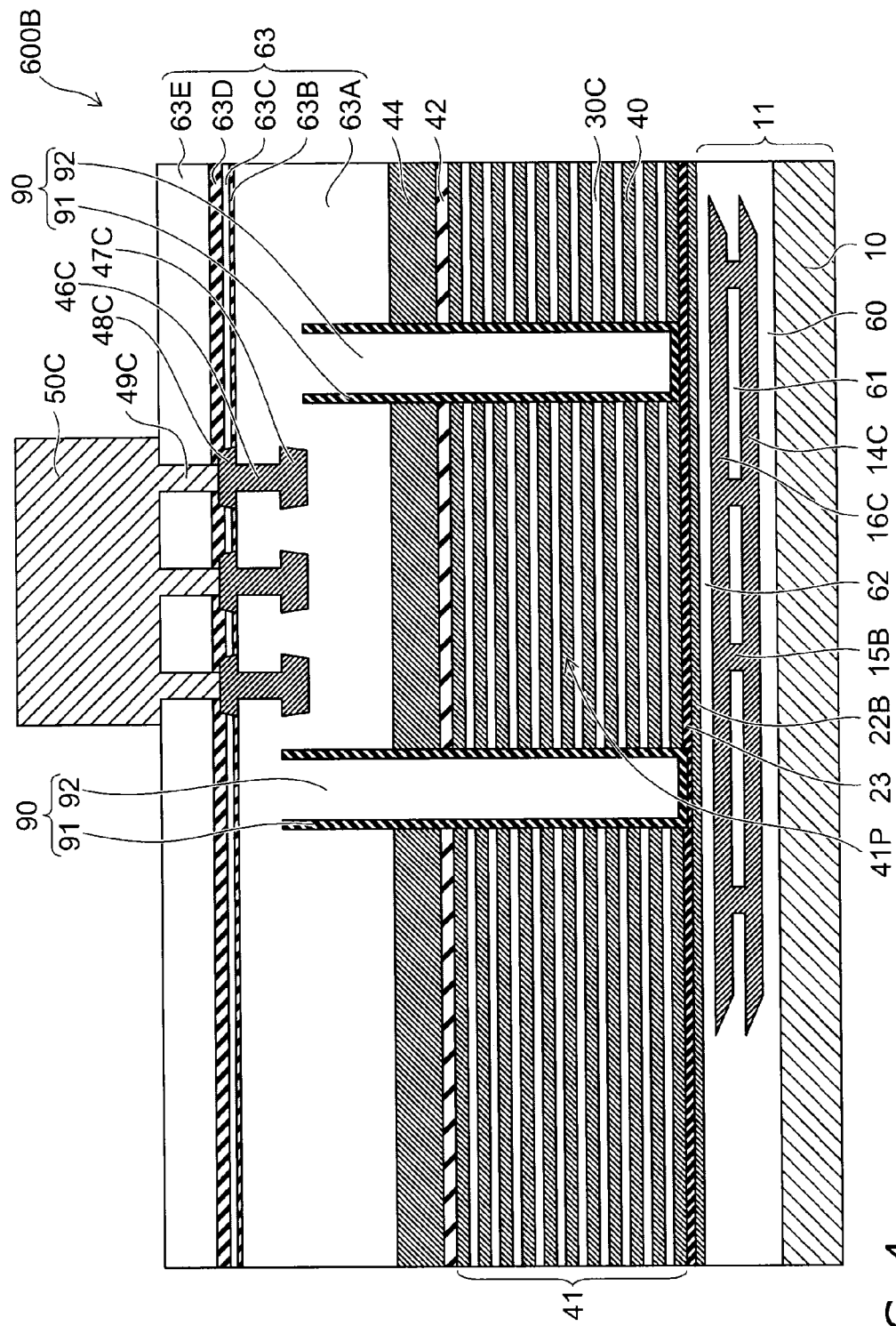
FIG. 4 is a schematic sectional view of the electrode pad formation region according to the first embodiment.

FIG. 4 is a schematic sectional view of the electrode pad formation region according to the first embodiment.

Figure 5:
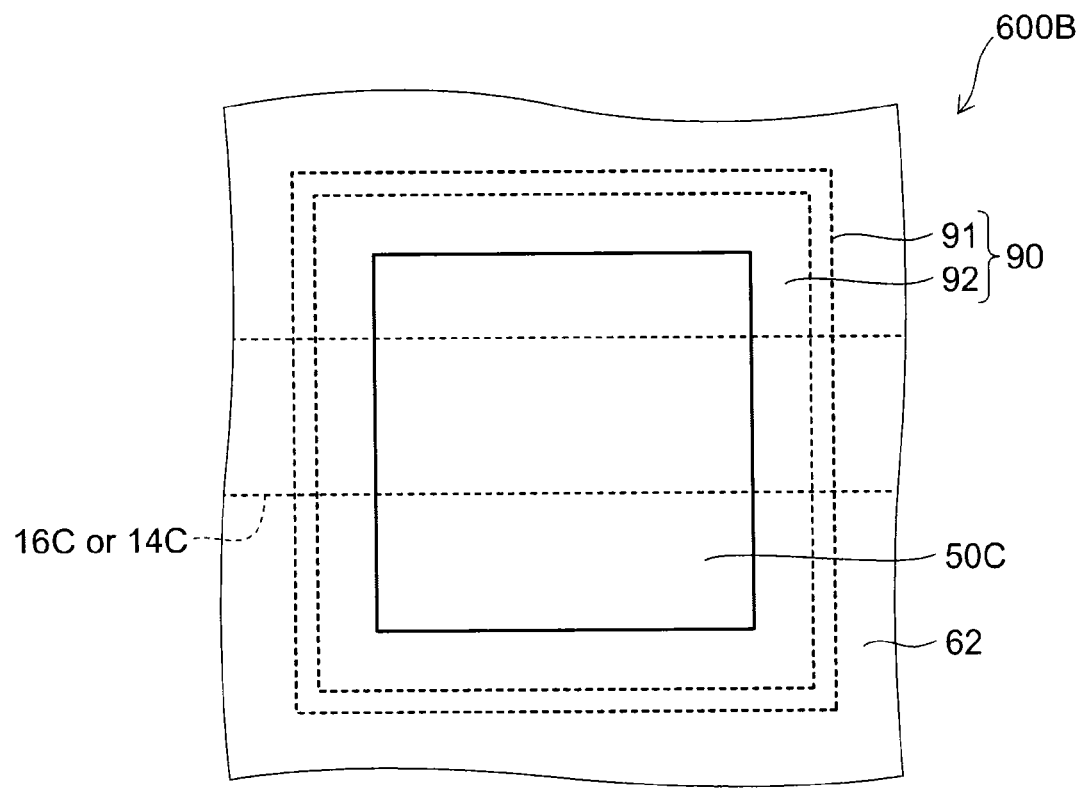
FIG. 5 is a schematic top view of the electrode pad formation region according to the first embodiment.

FIG. 5 is a schematic top view of the electrode pad formation region according to the first embodiment.

In the electrode pad formation region 600B according to the first embodiment, a wiring layer 16C (or wiring 14C) is routed below the electrode pad 50C. The wiring layer 16C (or wiring layer 14C) is one of the plurality of wiring layers provided in the foundation layer 11. The wiring layer 16C is connected to the wiring layer 14C through a via 15B.

The portion 41P of the stacked body 41 below the electrode pad 50C is electrically insulated from the stacked body 41 other than this portion 41P. For instance, an insulating layer 90 including a silicon nitride layer 91 and a silicon oxide layer 92 is interposed between the stacked body 41 of the portion 41P and the stacked body 41 other than the portion 41P. The electrode pad 50C bypasses the stacked body 41 of the portion 41P and is electrically connected to the wiring layer 16C (or wiring layer 14C).

Between the electrode pad 50C and the stacked body 41, the electrode pad formation region 600B includes a via 49C (first via) connected to the electrode pad 50C. The via 49C is located below the electrode pad 50C. The via 49C is surrounded with interlayer insulating films 63D, 63E.

Furthermore, between the electrode pad 50C and the stacked body 41, the electrode pad formation region 600B includes a conductive layer 48C (first conductive layer) connected to the via 49C. The conductive layer 48C is located below the via 49C. The conductive layer 48C is surrounded with interlayer insulating films 63A, 63B, 63C, 63D.

Furthermore, between the electrode pad 50C and the stacked body 41, the electrode pad formation region 600B includes a via 46C (second via) connected to the conductive layer 48C. The via 46C is located below the conductive layer 48C. The via 46C is surrounded with the interlayer insulating film 63A.

Furthermore, between the electrode pad 50C and the stacked body 41, the electrode pad formation region 600B includes a conductive layer 47C (second conductive layer) connected to the via 46C. The conductive layer 47C is located below the via 46C. The conductive layer 47C is surrounded with the interlayer insulating film 63A.

The material of the interlayer insulating films 60, 61, 62 is e.g. silicon oxide. The material of the interlayer insulating films 63A, 63C, 63E is e.g. silicon oxide. The material of the interlayer insulating films 63B, 63D is e.g. silicon nitride.

The material of the wiring layers 14C, 16C, the via 15B, the via 46C, and the conductive layers 47C, 48C is e.g. tungsten (W). The material of the electrode pad 50C and the via 49C is e.g. aluminum copper (AlCu). The material of the wiring layers 14C, 16C, the via 15B, the via 46C, and the conductive layers 47C, 48C is not limited thereto, but an optimal material is appropriately selected.

In the first embodiment, the wiring layer 14A in the device region, the wiring layer 14B in the peripheral circuit region 600A, and the wiring layer 14C in the electrode pad formation region 600B may be made of the same material. For instance, the wiring layer 14A, the wiring layer 14B, and the wiring layer 14C are each patterned from a layer of the same material in the process for manufacturing the nonvolatile semiconductor memory device 1.

The wiring layer 16A in the device region, the wiring layer 16B in the peripheral circuit region 600A, and the wiring layer 16C in the electrode pad formation region 600B may be made of the same material. For instance, the wiring layer 16A, the wiring layer 16B, and the wiring layer 16C are each patterned from a layer of the same material in the process for manufacturing the nonvolatile semiconductor memory device 1.

The wiring layer 50A in the device region, the wiring layer 50B in the peripheral circuit region 600A, and the electrode pad 50C in the electrode pad formation region 600B may be made of the same material. For instance, the wiring layer 50A, the wiring layer 50B, and the electrode pad 50C are each patterned from a layer of the same material in the process for manufacturing the nonvolatile semiconductor memory device 1.

That is, the height from the foundation layer 11 and the material of the wiring layer 50A are the same as the height from the foundation layer and the material of the electrode pad 50C.

Furthermore, the via 49B in the peripheral circuit region 600A and the via 49C in the electrode pad formation region 600B may be made of the same material. For instance, the via 49B and the via 49C are each patterned from a layer of the same material in the process for manufacturing the nonvolatile semiconductor memory device 1.

The bit line 48A in the device region, the wiring layer 48B in the peripheral circuit region 600A, and the conductive layer 48C in the electrode pad formation region 600B may be made of the same material. For instance, the bit line 48A, the wiring layer 48B, and the conductive layer 48C are each patterned from a layer of the same material in the process for manufacturing the nonvolatile semiconductor memory device 1.

That is, the height from the foundation layer 11 and the material of the bit line 48A are the same as the height from the foundation layer 11 and the material of the conductive layer 48C.

Furthermore, the via 46A in the device region, the via 46B in the peripheral circuit region 600A, and the via 46C in the electrode pad formation region 600B may be made of the same material. For instance, the via 46A, the via 46B, and the via 46C are each patterned from a layer of the same material in the process for manufacturing the nonvolatile semiconductor memory device 1.

The source line 47A in the device region, the wiring layer 47B in the peripheral circuit region 600A, and the conductive layer 47C in the electrode pad formation region 600B may be made of the same material. For instance, the source line 47A, the wiring layer 47B, and the conductive layer 47C are each patterned from a layer of the same material in the process for manufacturing the nonvolatile semiconductor memory device 1.

That is, the height from the foundation layer 11 and the material of the source line 47A are the same as the height from the foundation layer 11 and the material of the conductive layer 47C.

Figure 6:
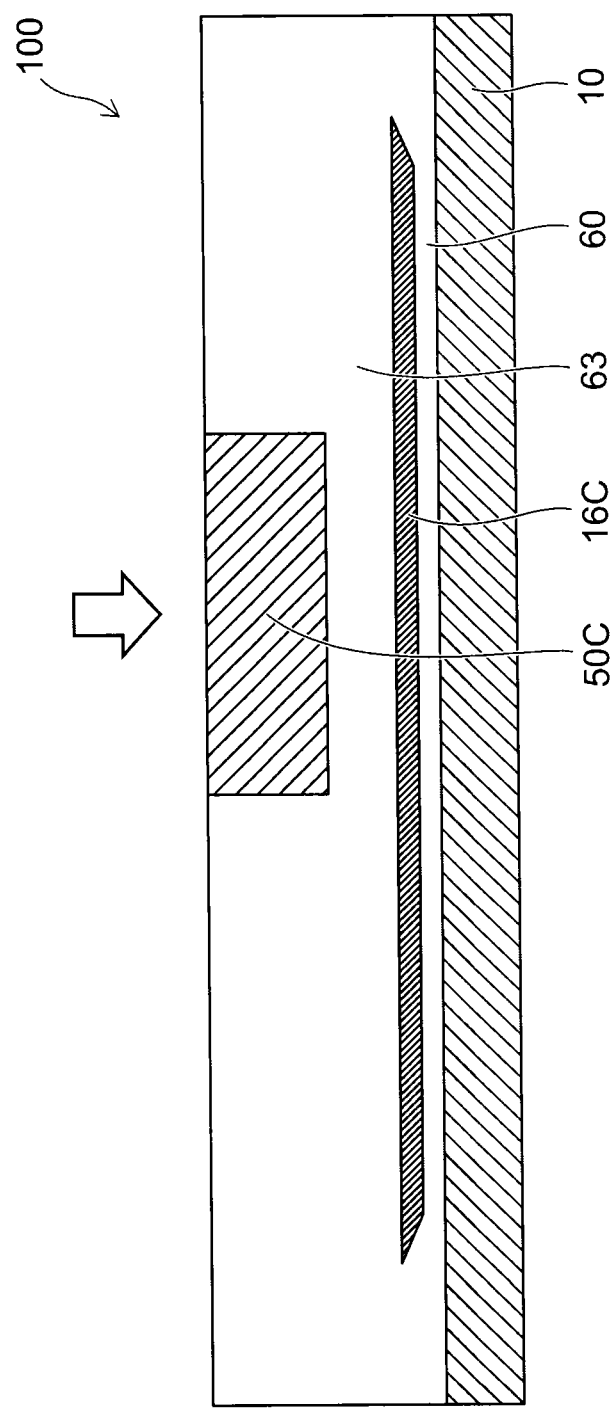
FIG. 6 is a schematic sectional view of an electrode pad formation region according to a reference example.

FIG. 6 is a schematic sectional view of an electrode pad formation region according to a reference example.

The nonvolatile semiconductor memory device 100 according to the reference example does not include the stacked body 41 and the conductive layers and vias on the stacked body 41 described above. Thus, the strength below the electrode pad 50C is weak. Accordingly, impact of a bonding tool on the electrode pad 50C (e.g., impact in the direction of the arrow) may destroy the interlayer insulating film 63 below the electrode pad 50C. Thus, in the nonvolatile semiconductor memory device 100, wiring layers and device elements cannot be placed below the electrode pad 50C.

For instance, a wiring layer 16C is routed below the electrode pad 50C as shown in FIG. 6. Then, the wiring layer 16C may be broken or deformed, and brought into contact with another wiring. Thus, in the nonvolatile semiconductor memory device 100, the wiring layer needs to be routed so as to bypass the electrode pad formation region. Accordingly, in the nonvolatile semiconductor memory device 100, the routing area of wiring layers must be ensured outside the electrode pad formation region. As a result, in the reference example, downsizing of the nonvolatile semiconductor memory device is limited.

In contrast, in the nonvolatile semiconductor memory device 1, the stacked body 41 having a thickness of 1.5 μm or more is provided below the electrode pad 50C. Furthermore, the vias 46C, 49C and the conductive layers 47C, 48C are placed between the electrode pad 50C and the stacked body 41. These vias 46C, 49C and conductive layers 47C, 48C are linked to each other and further connected to the electrode pad 50C. Furthermore, these vias and conductive layers are surrounded with the interlayer insulating film 63 in order to avoid short circuit between the vias 46C, 49C and the conductive layers 47C, 48C.

More specifically, in the nonvolatile semiconductor memory device 1, the stacked body 41, the vias 46C, 49C, the conductive layers 47C, 48C, and the interlayer insulating film 63 function as a buffer and can relax the impact of the bonding tool below the electrode pad 50C. This makes the interlayer insulating films 60, 61, 62 below the electrode pad 50C less prone to destruction, and allows wiring layers to be routed below the electrode pad 50C. Thus, in the nonvolatile semiconductor memory device 1, there is no need to provide a routing area of wiring layers outside the electrode pad formation region. This realizes downsizing of the nonvolatile semiconductor memory device.

Furthermore, in the nonvolatile semiconductor memory device 1, the portion 41P of the stacked body 41 below the electrode pad 50C is electrically insulated from the stacked body 41 other than the portion 41P. Thus, even if electrical noise is superimposed on the electrode layer 40 of the stacked body 41 other than the portion 41P, this electrical noise is shielded by the insulating layer 90. That is, the electrode pad 50C is made less susceptible to electrical noise from the stacked body 41 other than the portion 41P.

Furthermore, in the process for manufacturing the nonvolatile semiconductor memory device 1, the electrode pad 50C is patterned along with the wiring layer 50A and the wiring layer 50B. The conductive layer 48C is patterned along with the bit line 48A and the wiring layer 48B. The conductive layer 47C is patterned along with the source line 47A and the wiring layer 47B. The via 49C is patterned along with the via 49B. Moreover, the via 46C is patterned along with the via 46A and the via 46B.

Thus, in the first embodiment, there is no need of a dedicated process for manufacturing the electrode pad 50C, the vias 46C, 49C, and the conductive layers 47C, 48C. Accordingly, providing the nonvolatile semiconductor memory device with the electrode pad 50C, the vias 46C, 49C, and the conductive layers 47C, 48C causes no increase in manufacturing steps and cost.

(Second Embodiment)

The vias 46C, 49C and the conductive layers 47C, 48C do not need to be linked, but one of them may be placed singly, or two or more of them may be combined. This embodiment is now described.

Figure 7:
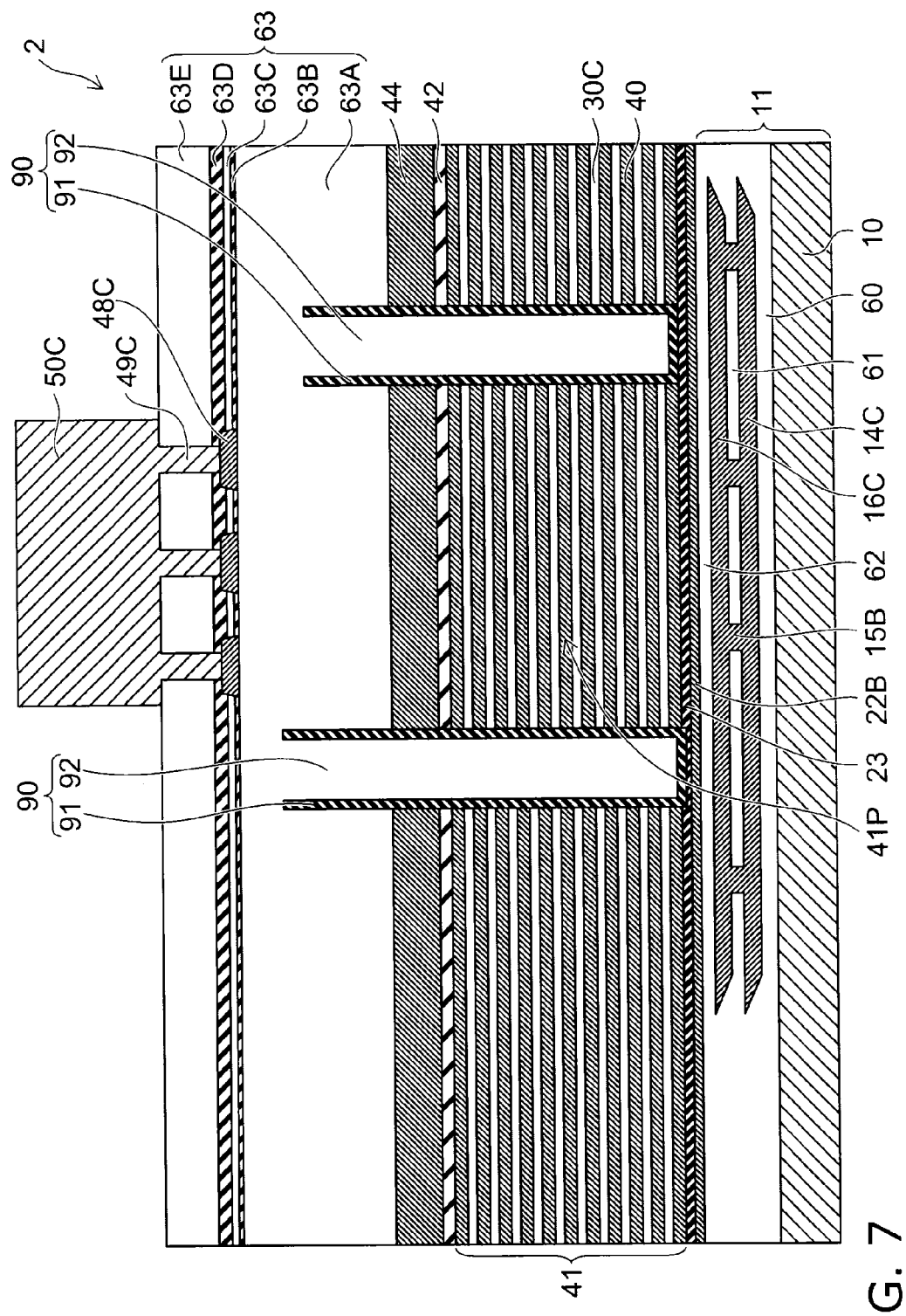
FIG. 7 is a schematic sectional view of an electrode pad formation region according to a second embodiment.

FIG. 7 is a schematic sectional view of an electrode pad formation region according to a second embodiment.

In the nonvolatile semiconductor memory device 2 according to the second embodiment, the via 46C and the conductive layer 47C are removed from the electrode pad formation region of the first embodiment, and a via 49C and a conductive layer 48C are provided below the electrode pad 50C. The rest of the structure is the same as that of the first embodiment.

Such a structure achieves an effect similar to that of the first embodiment. Furthermore, by the amount of the removal of the via 46C and the conductive layer 47C, the ground capacitance of the electrode pad 50C is increased. Thus, the memory cell can be driven more rapidly.

(Third Embodiment)

Figure 8:
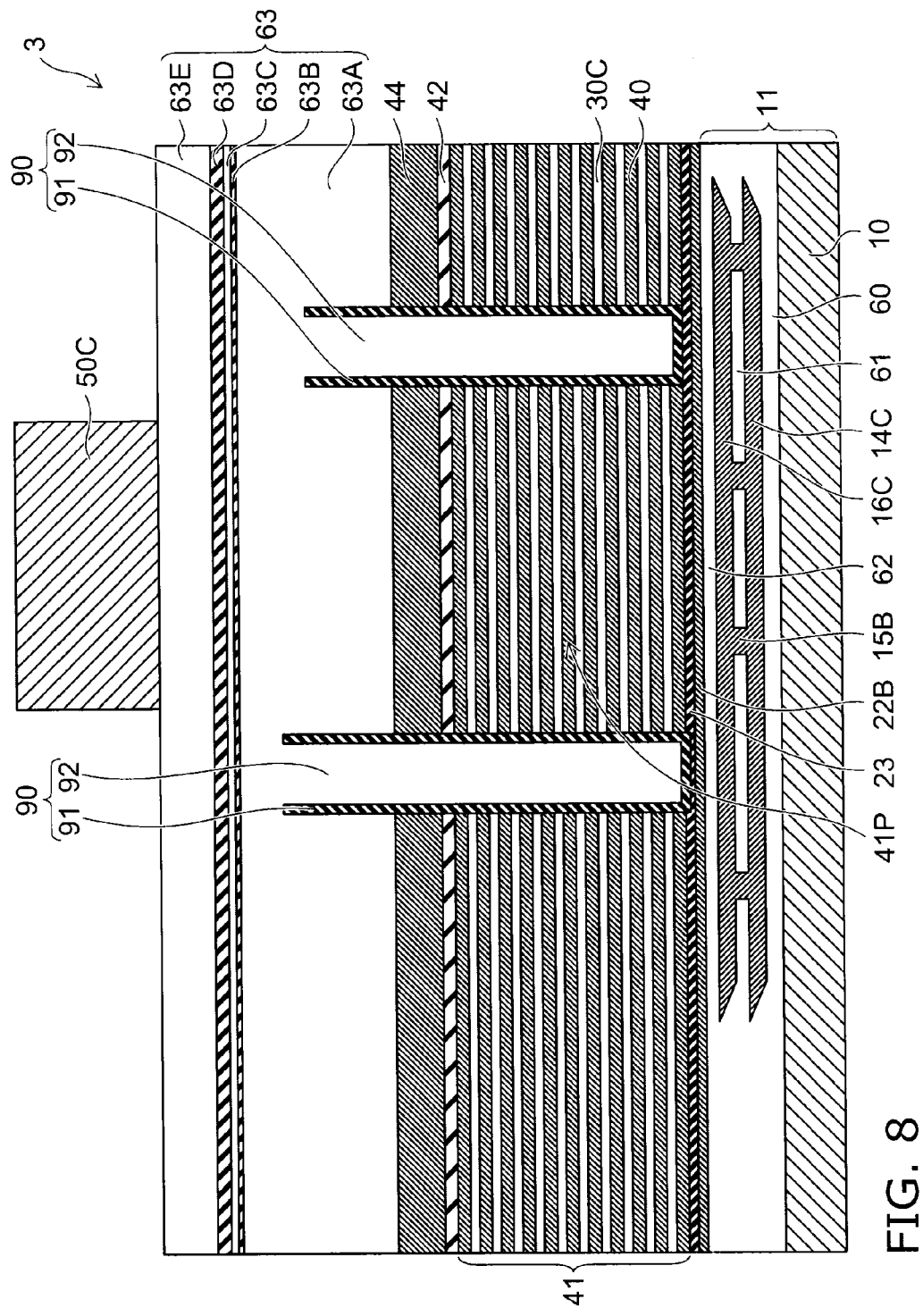
FIG. 8 is a schematic sectional view of an electrode pad formation region according to a third embodiment.

FIG. 8 is a schematic sectional view of an electrode pad formation region according to a third embodiment.

In the nonvolatile semiconductor memory device 3 according to the third embodiment, the via 46C, the conductive layer 47C, the via 49C, and the conductive layer 48C are removed from the electrode pad formation region of the first embodiment. The rest of the structure is the same as that of the first embodiment.

Such a structure achieves an effect similar to that of the first and second embodiments. Furthermore, by the amount of the removal of the via 46C, the conductive layer 47C, the via 49C, and the conductive layer 48C, the ground capacitance of the electrode pad 50C is further increased as compared with the second embodiment. Thus, the memory cell can be driven more rapidly.

(Fourth Embodiment)

Figure 9:
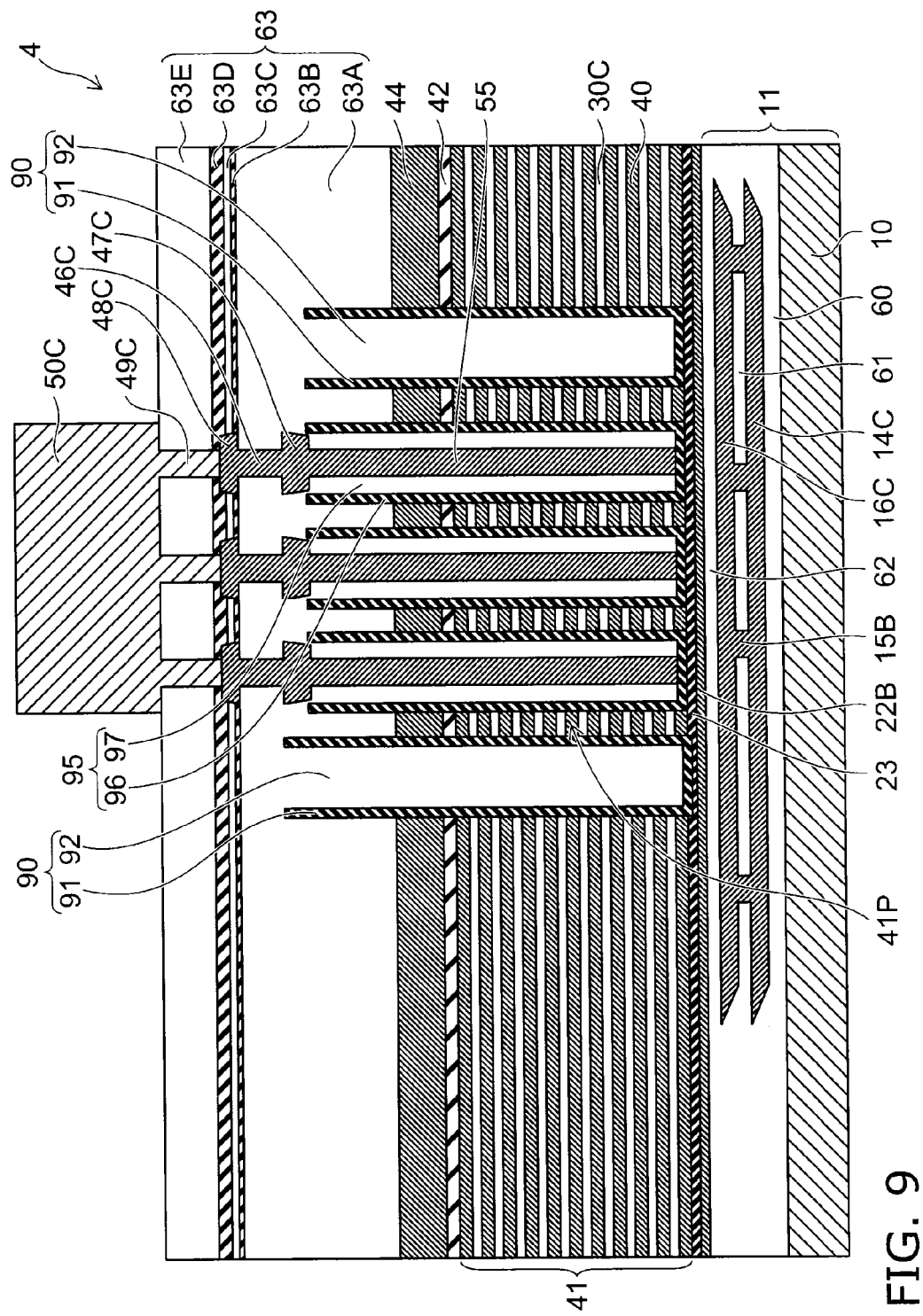
FIG. 9 is a schematic sectional view of an electrode pad formation region according to a fourth embodiment.

FIG. 9 is a schematic sectional view of an electrode pad formation region according to a fourth embodiment.

In the nonvolatile semiconductor memory device 4 according to the fourth embodiment, a via 55 (third via) is added to the electrode pad formation region of the first embodiment. The material of the via 55 is e.g. tungsten. The via 55 is located below the conductive layer 47C. The via 55 is connected to the conductive layer 47C. The via 55 is provided between the foundation layer 11 and the conductive layer 47C. Furthermore, the via 55 is electrically insulated from the stacked body 41 of the portion 41P. For instance, an insulating layer 95 including a silicon nitride layer 96 and a silicon oxide layer 97 is provided between the via 55 and the stacked body 41 of the portion 41P.

Such a structure achieves an effect similar to that of the first embodiment. Furthermore, by the via 55 thus provided, the strength below the electrode pad 50C is further reinforced. Furthermore, the via 55 is electrically insulated from the stacked body 41 of the portion 41P. Thus, for instance, even if electrical noise is externally superimposed by capacitive coupling on the electrode layer 40 of the stacked body 41 of the portion 41P, this electrical noise is shielded by the insulating layer 95.

(Fifth Embodiment)

Figure 10:
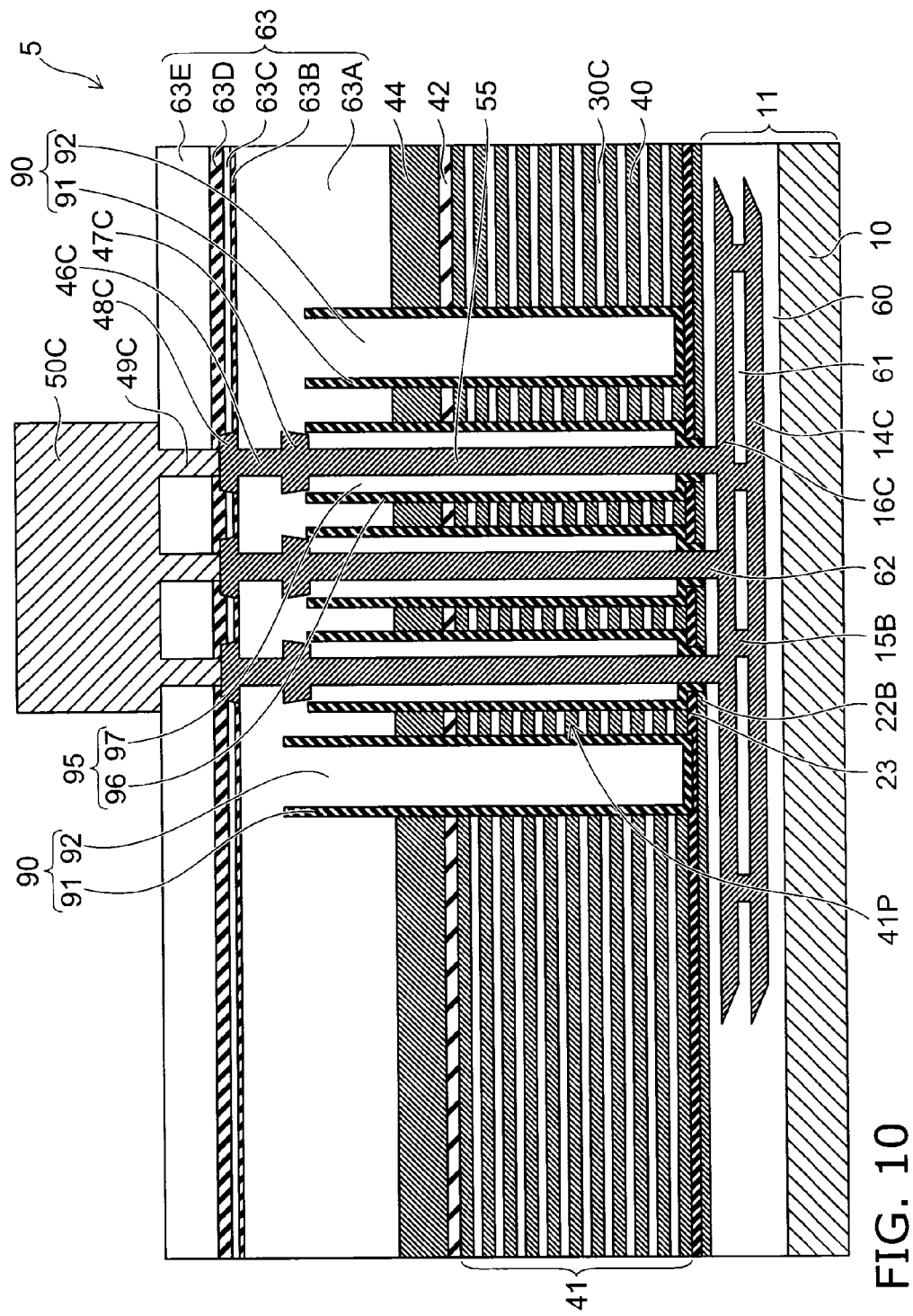
FIG. 10 is a schematic sectional view of an electrode pad formation region according to a fifth embodiment.

FIG. 10 is a schematic sectional view of an electrode pad formation region according to a fifth embodiment.

In the nonvolatile semiconductor memory device 5 according to the fifth embodiment, the via 55 described in the fourth embodiment is extended further downward and electrically connected to the wiring layer 16C. The wiring layer 16C is located below the electrode pad 50C.

Such a structure achieves an effect similar to that of the fourth embodiment. Furthermore, the electrode pad 50C is brought into continuity with the wiring layer 16C. Thus, there is no need to connect the electrode pad 50C to the wiring layer 16C by bypassing the stacked body 41 of the portion 41P. This further decreases the distance of the wiring line between the electrode pad 50C and the wiring layer 16C, and reduces the electrical resistance of the wiring line between the electrode pad 50C and the wiring layer 16C. Furthermore, because there is no need to connect the electrode pad 50C to the wiring layer 16C by bypassing the stacked body 41 of the portion 41P, other wirings can be routed in the bypassed location. This increases the routing flexibility of wiring layers.

(Sixth Embodiment)

Figure 11:
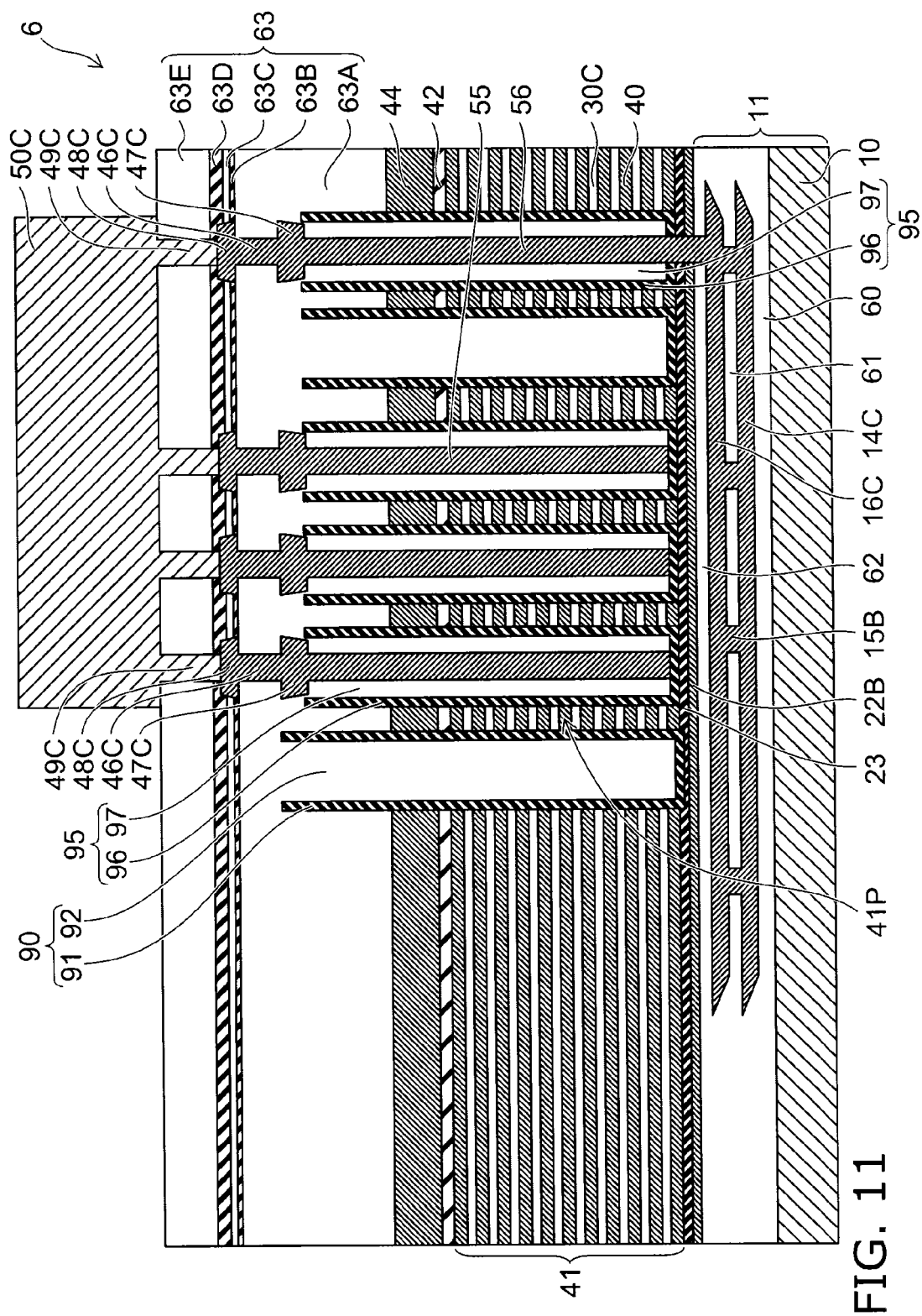
FIG. 11 is a schematic sectional view of an electrode pad formation region according to a sixth embodiment.

FIG. 11 is a schematic sectional view of an electrode pad formation region according to a sixth embodiment.

In the nonvolatile semiconductor memory device 6 according to the sixth embodiment, a conductive line linking the electrode pad 50C to the wiring layer 16C is added outside the stacked body 41 of the portion 41P in the electrode pad formation region of the fourth embodiment. For instance, the electrode pad 50C and the wiring layer 16C are connected outside the stacked body 41 of the portion 41P through the via 49C, the conductive layer 48C, the via 46C, the conductive layer 47C, and a via 56. The material of the via 56 is e.g. tungsten. This conductive line is located below the electrode pad 50C.

Such a structure achieves an effect similar to that of the fourth embodiment. Furthermore, a conductive line is provided outside the stacked body 41 of the portion 41P. Thus, the strength below the electrode pad 50C is further reinforced.

(Seventh Embodiment)

Figure 12:
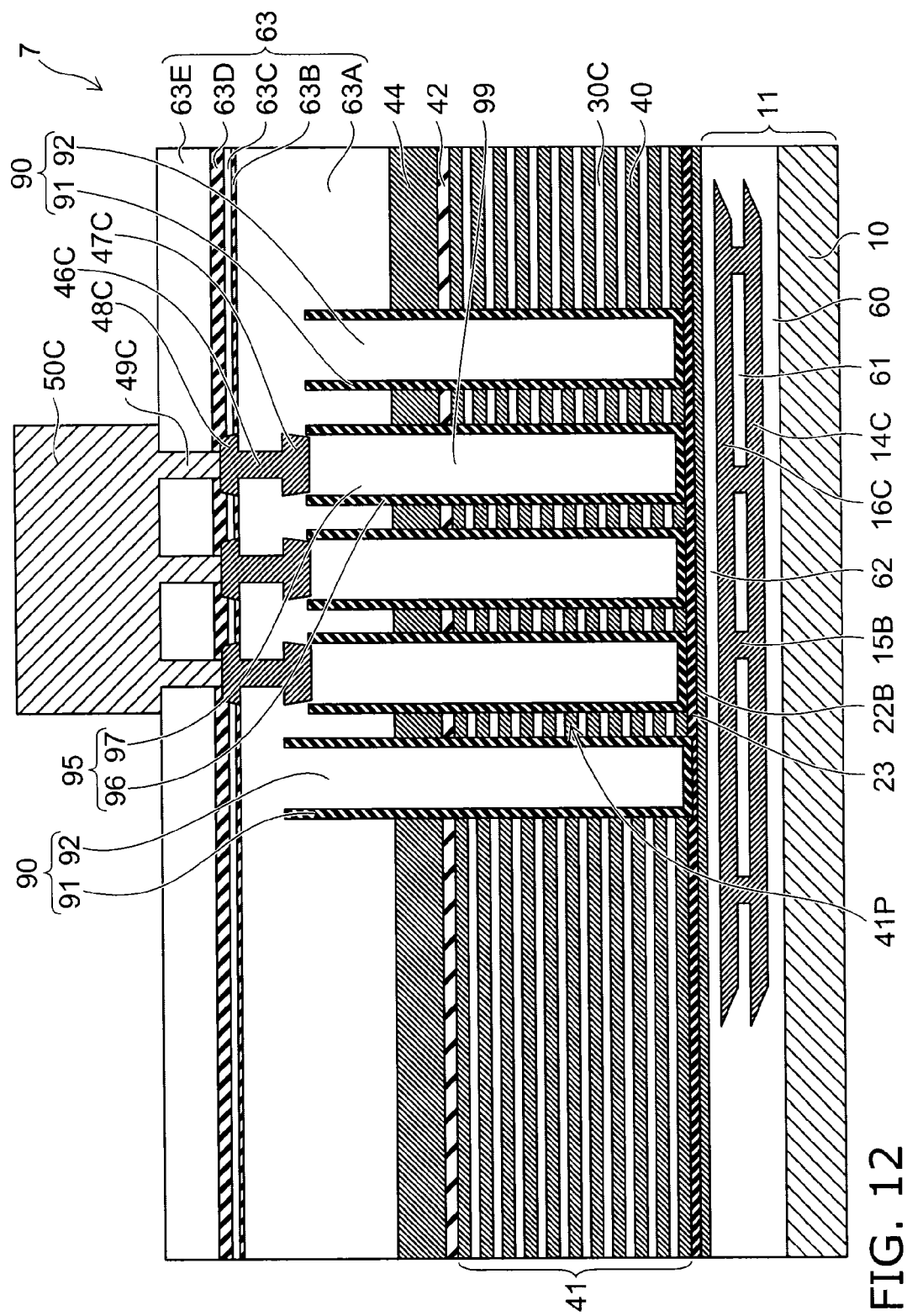
FIG. 12 is a schematic sectional view of an electrode pad formation region according to a seventh embodiment.

FIG. 12 is a schematic sectional view of an electrode pad formation region according to a seventh embodiment.

In the nonvolatile semiconductor memory device 7 according to the seventh embodiment, an insulating layer 99 is added to the electrode pad formation region of the first embodiment. The insulating layer 99 is located below the conductive layer 47C and is in contact with the conductive layer 47C. The insulating layer 99 penetrates through the stacked body 41. The material of the insulating layer 99 is e.g. silicon oxide.

Such a structure achieves an effect similar to that of the first embodiment. Furthermore, the parasitic capacitance below the electrode pad 50C is further reduced. Thus, the memory cell can be driven more rapidly. Furthermore, the insulating layer 99 may include a low-k material. The insulating layer 99 including a low-k material further reduces the parasitic capacitance below the electrode pad 50C. Thus, the memory cell can be driven more rapidly.

(Eighth Embodiment)

Figure 13:
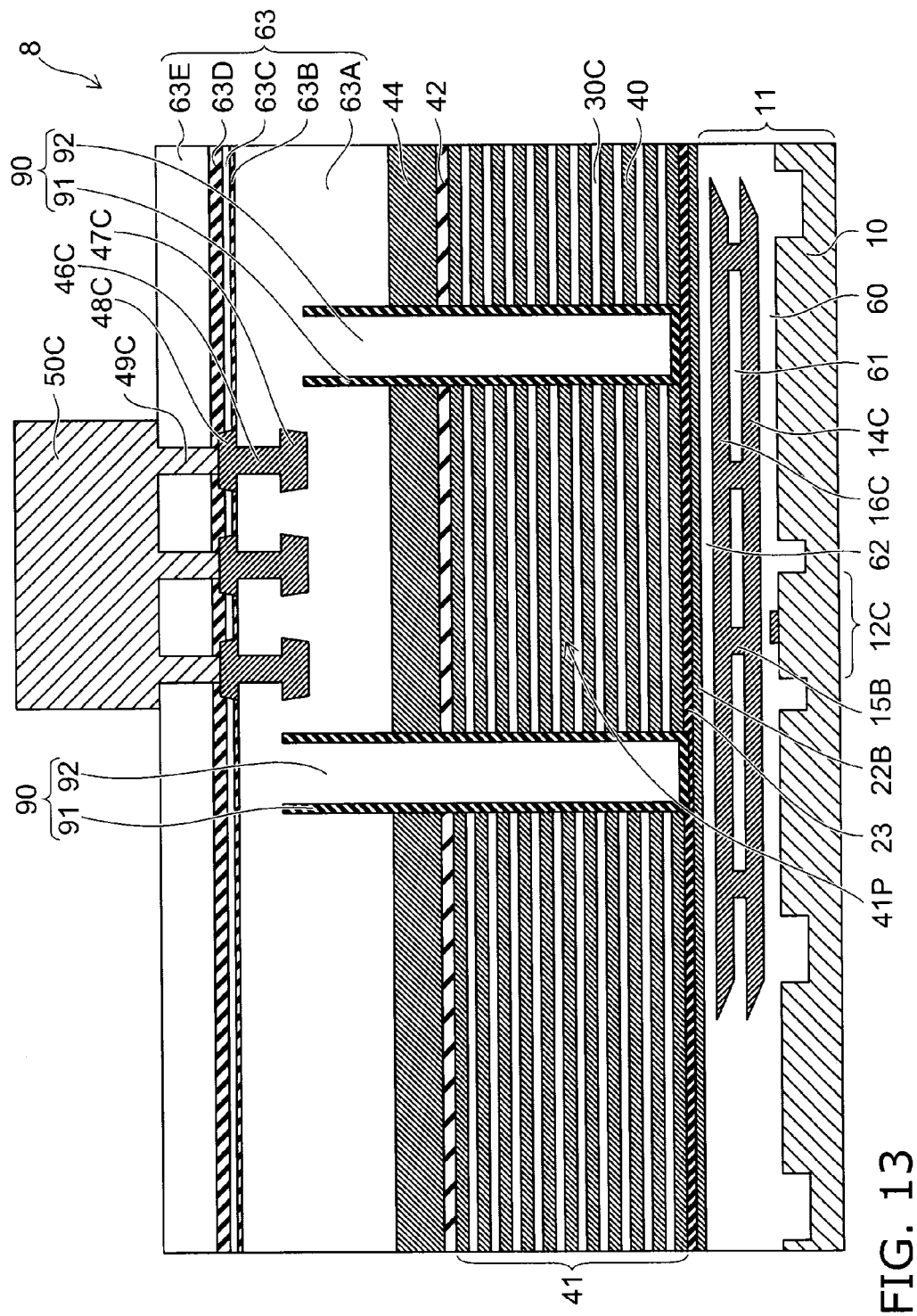
FIG. 13 is a schematic sectional view of an electrode pad formation region according to an eighth embodiment.

FIG. 13 is a schematic sectional view of an electrode pad formation region according to an eighth embodiment.

In the nonvolatile semiconductor memory device 8 according to the eighth embodiment, a device element is added to the electrode pad formation region of the first embodiment. For instance, at least one of the plurality of device elements (e.g., transistor 12C) is placed below the electrode pad 50C. The device element is not limited to a transistor, but may be e.g. a diode, capacitor, coil, and resistor element. Besides, FIG. 13 shows a situation in which at least one of the plurality of wiring layers (e.g., wiring layer 16C) is placed below the electrode pad 50C.

Such a structure achieves an effect similar to that of the first embodiment. Furthermore, a device element is placed below the electrode pad 50C. This increases the layout flexibility of device elements in the foundation layer 11 of the nonvolatile semiconductor memory device.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device including a memory cell region provided with a plurality of memory cells, and a peripheral region provided around the memory cell region, the device comprising:
    a foundation layer provided in the memory cell region and in the peripheral region, the foundation layer including a plurality of wiring layers and a plurality of device elements; and
    a stacked body provided on the foundation layer, the stacked body including a plurality of electrode layers and a plurality of intermediate layers alternately stacked,
    the memory cell region including:
        a first channel body layer penetrating through the stacked body and the first channel body layer extending from an upper surface of the stacked body to a lower surface of the stacked body;
        a memory film provided between first channel body layer and each of the plurality of electrode layers;
        a pair of select gate electrodes provided on the stacked body;
        a second channel body layer penetrating through each of the pair of select gate electrodes and the second channel body layer being connected to the first channel body layer; and
        a gate insulating film provided between each of the pair of select gate electrodes and the second channel body layer, and the peripheral region including:
        an interlayer insulating film provided on the stacked body; and
        an electrode pad provided on the interlayer insulating film, a bonding wire being capable of being bonded to the electrode pad, at least one of the plurality of wiring layers being provided below the electrode pad.

2. The device according to claim 1, wherein the cell region further includes a bit line connected to the second channel body layer connected to the first channel body layer, and a position of the electrode pad is higher than a position of the bit line.

3. The device according to claim 1, wherein a portion of the stacked body below the electrode pad is electrically insulated from the stacked body other than the portion.

4. The device according to claim 1, wherein
    the peripheral region further includes a first via connected to the electrode pad between the electrode pad and the stacked body, and
    the first via is located below the electrode pad and further surrounded with the interlayer insulating film.

5. The device according to claim 4, wherein
    the peripheral region further includes a first conductive layer connected to the first via between the electrode pad and the stacked body, and
    the first conductive layer is located below the first via and further surrounded with the interlayer insulating film.

6. The device according to claim 5, wherein
the peripheral region further includes a second via connected to the first conductive layer between the electrode pad and the stacked body, and
the second via is located below the first conductive layer and further surrounded with the interlayer insulating film.

7. The device according to claim 6, wherein
the peripheral region further includes a second conductive layer connected to the second via between the electrode pad and the stacked body, and
the second conductive layer is located below the second via and further surrounded with the interlayer insulating film.

8. The device according to claim 7, wherein the peripheral region further includes a third via connected to the second conductive layer below the second conductive layer.

9. The device according to claim 8, wherein
a portion of the stacked body below the electrode pad is electrically insulated from the stacked body other than the portion,
the third via is provided between the foundation layer and the second conductive layer, and
the third via is further electrically insulated from the portion of the stacked body.

10. The device according to claim 8, wherein the third via is electrically connected to one of the plurality of wiring layers.

11. The device according to claim 10, wherein the one of the plurality of wiring layers connected to the third via is located below the electrode pad.

12. The device according to claim 3, wherein the electrode pad bypasses the portion of the stacked body below the electrode pad and is electrically connected to one of the plurality of wiring layers.

13. The device according to claim 7, wherein
the peripheral region further includes an insulating layer in contact with the second conductive layer below the second conductive layer, and
the insulating layer penetrates through the stacked body.

14. The device according to claim 13, wherein the insulating layer includes a low-k material.

15. The device according to claim 5, wherein
the cell region further includes a bit line connected to the second channel body layer connected to the first channel body layer, and
height from the foundation layer and material of the bit line are same as height from the foundation layer and material of the first conductive layer.

16. The device according to claim 7, wherein
the cell region further includes a source line connected to the second channel body layer connected to the first channel body layer, and
height from the foundation layer and material of the source line are same as height from the foundation layer and material of the second conductive layer.

17. The device according to claim 1, wherein
the cell region further includes a different wiring layer on the bit line, and
height from the foundation layer and material of the different wiring layer are same as height from the foundation layer and material of the electrode pad.

18. The device according to claim 1, wherein at least one of the plurality of device elements is placed below the electrode pad.

19. The device according to claim 1, wherein at least one of the plurality of device elements and at least one of the plurality of wiring layers are placed below the electrode pad.

20. The device according to claim 1, wherein the plurality of intermediate layers include silicon or silicon oxide.

* * * * *